(12) United States Patent
Koma et al.

(10) Patent No.: US 9,905,451 B2
(45) Date of Patent: Feb. 27, 2018

(54) SHEET FOR SEMICONDUCTOR-RELATED-MEMBER PROCESSING AND METHOD OF MANUFACTURING CHIPS USING THE SHEET

(71) Applicant: LINTEC CORPORATION, Tokyo (JP)

(72) Inventors: Yosuke Koma, Tokyo (JP); Takuo Nishida, Tokyo (JP); Misaki Sakamoto, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 15/122,195

(22) PCT Filed: Mar. 2, 2015

(86) PCT No.: PCT/JP2015/056042
§ 371 (c)(1),
(2) Date: Aug. 29, 2016

(87) PCT Pub. No.: WO2015/133420
PCT Pub. Date: Sep. 11, 2015

(65) Prior Publication Data
US 2016/0372358 A1    Dec. 22, 2016

(30) Foreign Application Priority Data
Mar. 3, 2014    (JP) .................................. 2014-041020

(51) Int. Cl.
*H01L 23/544*    (2006.01)
*H01L 21/78*    (2006.01)
(Continued)

(52) U.S. Cl.
CPC ............ *H01L 21/6836* (2013.01); *C09J 4/00* (2013.01); *C09J 5/00* (2013.01); *C09J 5/06* (2013.01);
(Continued)

(58) Field of Classification Search
CPC ......... H01L 21/68; H01L 21/78; H01L 21/56; H01L 21/48; H01L 21/67
(Continued)

(56) References Cited

U.S. PATENT DOCUMENTS

| | | | |
|---|---|---|---|
| 6,524,701 B1 * | 2/2003 | Kondo | ..................... B32B 27/36 427/208 |
| 7,875,501 B2 * | 1/2011 | Tanaka | .................. B24B 37/042 257/E21.235 |

(Continued)

FOREIGN PATENT DOCUMENTS

| | | |
|---|---|---|
| JP | 2007-220694 A | 8/2007 |
| JP | 2008-192917 A | 8/2008 |

(Continued)

OTHER PUBLICATIONS

International Search Report of the International Searching Authority dated Apr. 7, 2015 for the corresponding International application No. PCT/JP2015/056042 (and English translation).

*Primary Examiner* — Sheikh Maruf
(74) *Attorney, Agent, or Firm* — Posz Law Group, PLC

(57) ABSTRACT

As a semiconductor-related-member processing sheet which can stably achieve to enhance the removability of the semiconductor-related-member processing sheet and to suppress the reliability degradation of members comprising chips manufactured from a semiconductor-related member using the semiconductor-related-member processing sheet, there is provided a semiconductor-related-member processing sheet, comprising a base material and a pressure sensi- (Continued)

tive adhesive layer provided on or above one surface of the base material, wherein the pressure sensitive adhesive layer comprises one or more types of energy ray polymerizable compounds having an energy ray polymerizable functional group, wherein at least one type of the energy ray polymerizable compounds is a polymerizable branched polymer that is a polymer having a branched structure, wherein a contact angle on a measurement target surface is 40° or less when measured using a water droplet under an environment of 25° C. and a relative humidity of 50%.

11 Claims, 1 Drawing Sheet

(51) Int. Cl.
| | |
|---|---|
| H01L 21/68 | (2006.01) |
| H01L 23/02 | (2006.01) |
| H01L 21/683 | (2006.01) |
| C09J 133/06 | (2006.01) |
| C09J 7/02 | (2006.01) |
| C09J 4/00 | (2006.01) |
| C09J 201/02 | (2006.01) |
| C09J 5/00 | (2006.01) |
| C09J 5/06 | (2006.01) |
| H01L 21/324 | (2006.01) |
| C08F 220/06 | (2006.01) |
| C09J 4/06 | (2006.01) |

(52) U.S. Cl.
CPC ........... *C09J 7/0217* (2013.01); *C09J 7/0246* (2013.01); *C09J 133/06* (2013.01); *C09J 201/02* (2013.01); *H01L 21/324* (2013.01); *H01L 21/78* (2013.01); *C08F 220/06* (2013.01); *C09J 4/06* (2013.01); *C09J 2201/122* (2013.01); *C09J 2201/622* (2013.01); *C09J 2203/326* (2013.01); *C09J 2205/302* (2013.01); *C09J 2205/31* (2013.01); *H01L 2221/68322* (2013.01); *H01L 2221/68327* (2013.01)

(58) Field of Classification Search
USPC ........ 438/113, 106–110, 118, 460, 462, 464; 257/620, 659, 778, 787, E21.599, 257/E21.499, E21.506, E21.505
See application file for complete search history.

(56) References Cited

U.S. PATENT DOCUMENTS

| | | | | |
|---|---|---|---|---|
| 2001/0055678 A1* | 12/2001 | Murata | ................... | C09J 7/0246 428/346 |
| 2003/0235686 A1* | 12/2003 | Caspari | ................. | C08F 220/12 428/343 |
| 2004/0003883 A1* | 1/2004 | Kiuchi | ................... | C09J 7/0207 156/77 |
| 2004/0020338 A1* | 2/2004 | Ookawa | ................... | B32B 17/10 83/13 |
| 2004/0126575 A1* | 7/2004 | Yoshida | ................... | B32B 27/08 428/343 |
| 2004/0191510 A1* | 9/2004 | Kiuchi | ................... | C09J 7/0207 428/355 RA |
| 2005/0031861 A1* | 2/2005 | Matsumura | ............ | C09J 7/0296 428/354 |
| 2006/0188725 A1* | 8/2006 | Yoshida | ................... | B32B 27/40 428/411.1 |
| 2006/0257651 A1 | 11/2006 | Shintani et al. | | |
| 2007/0026572 A1* | 2/2007 | Hatakeyama | .......... | C09J 7/0203 438/113 |
| 2007/0241436 A1* | 10/2007 | Ookubo | ................. | C08G 59/18 257/678 |
| 2008/0011415 A1* | 1/2008 | Kiuchi | ................ | H01L 21/6835 156/247 |
| 2008/0085409 A1* | 4/2008 | Kiuchi | ................... | C09J 109/06 428/343 |
| 2009/0081852 A1* | 3/2009 | Tanaka | ................... | B24B 37/042 438/464 |
| 2010/0129987 A1* | 5/2010 | Kamiya | ................... | B32B 7/12 438/464 |
| 2011/0281399 A1* | 11/2011 | Ookubo | ................ | C08G 59/18 438/113 |
| 2013/0236673 A1* | 9/2013 | Kim | ...................... | C09J 133/14 428/41.5 |
| 2014/0044961 A1 | 2/2014 | Takami et al. | | |
| 2015/0357223 A1* | 12/2015 | Takamoto | ............ | H01L 23/544 257/778 |

FOREIGN PATENT DOCUMENTS

| | | | |
|---|---|---|---|
| JP | 2010-106283 A | 5/2010 | |
| JP | 2010106283 A | * 5/2010 | ......... H01L 21/6836 |
| JP | 2014-034655 A | 2/2014 | |

* cited by examiner

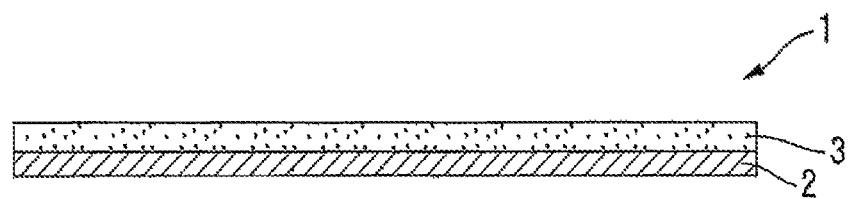

SHEET FOR SEMICONDUCTOR-RELATED-MEMBER PROCESSING AND METHOD OF MANUFACTURING CHIPS USING THE SHEET

CROSS REFERENCE TO RELATED APPLICATIONS

This application is a U.S. national stage application of PCT/JP2015/056042 filed on Mar. 2, 2015, which claims priority to Japanese Patent Application No. 2014-041020 filed on Mar. 3, 2014, the contents of which are incorporated herein by reference.

TECHNICAL FIELD

The present invention relates to a semiconductor-related-member processing sheet used when manufacturing chips that are members formed by dividing and processing a semiconductor-related member such as a silicon wafer. The present invention also relates to a method of manufacturing chips using the semiconductor-related-member processing sheet.

BACKGROUND ART

One example of a method of manufacturing chips from a semiconductor-related member such as a silicon wafer may be mentioned as follows. First, a semiconductor-related-member processing sheet, which comprises a base material and a pressure sensitive adhesive layer, is prepared, and the surface of the sheet at the side of the pressure sensitive adhesive layer is attached to a surface of a semiconductor-related member on which circuits are formed (this surface may be referred to as a "member front surface" in the present description). The semiconductor-related member is then ground from the side of an exposed surface opposite to the member front surface to reduce the thickness of the semiconductor-related member. Subsequently, another semiconductor-related-member processing sheet is attached to the ground surface of the semiconductor-related member (this surface may be referred to as a "member back surface" in the present description), and the semiconductor-related-member processing sheet attached to the member front surface is removed. Thereafter, a dividing process is performed for the semiconductor-related member to which the other semiconductor-related-member processing sheet is attached, and a structure is obtained in a state in which many chips are attached to the surface of the other semiconductor-related-member processing sheet at the side of the pressure sensitive adhesive layer. Finally, the chips can be obtained after being individually picked up from the structure.

Thus, when manufacturing chips from a semiconductor-related member, work to attach a semiconductor-related-member processing sheet to and remove it from the surface of the semiconductor-related member or the surfaces of the chips (including pickup work, here and hereinafter) may sometimes be performed. Semiconductor-related members may have a reduced thickness of about several tens micrometers as in the case of a silicon wafer after grinding, and therefore, enhancing the removability of semiconductor-related-member processing sheets is an important issue in regard to quality control of the semiconductor-related members.

The "removability" as used in the present description refers to one of properties of a semiconductor-related-member processing sheet, i.e. a property of avoiding quality issues, such as cracks and breakage, of an adherend when removing the semiconductor-related-member processing sheet from the adherend (a semiconductor-related member or chips in a state in which the semiconductor-related-member processing sheet is attached thereto may be referred to as an "adherend" in a collective term, here and hereinafter). The suitability for pickup, which is a property of avoiding cracks, breakage, etc. of chips by reducing the force applied to the chips when picking up the chips from a dicing sheet, can be positioned as one specific example of the above removability. By using a semiconductor-related-member processing sheet which is excellent in the removability, the problems such as cracks and breakage of an adherend are unlikely to occur when removing the semiconductor-related-member processing sheet from the adherend.

To enhance the removability of a semiconductor-related-member processing sheet, the pressure sensitive adhesive layer of the sheet is ordinarily designed such that the pressure sensitive adhesive property is reduced by a specific stimulus, which may be irradiation of an energy ray such as ultraviolet ray and electron ray.

In view of eliminating pickup failure, i.e. in view of enhancing the removability in pickup from a dicing tape, Patent Literature 1 discloses a technique of including a free epoxy group-containing compound in a pressure sensitive adhesive layer.

PRIOR ART LITERATURE

Patent Literature

[Patent Literature 1] JP2008-192917A

SUMMARY OF THE INVENTION

Problems to be Solved by the Invention

As disclosed in Patent Literature 1, including a free epoxy group-containing compound in a pressure sensitive adhesive layer is one of effective means to reduce the pickup time and reduce the pickup force. However, if the removability of a semiconductor-related-member processing sheet is to be further enhanced only by the above means, it will be necessary to increase the content of the free epoxy group-containing compound in the pressure sensitive adhesive layer. The present inventors have revealed a possibility that, when chips are manufactured from a semiconductor-related member using a semiconductor-related-member processing sheet that comprises a pressure sensitive adhesive layer in which the content of the free epoxy group-containing compound is increased, the reliability of members comprising the chips (specific examples include mold chips and chips with protective films) may be difficult to maintain.

In view of such existing circumstances, an object of the present invention is to provide a semiconductor-related-member processing sheet which can stably suppress the reliability degradation of members comprising chips manufactured from a semiconductor-related member using the semiconductor-related-member processing sheet and which can preferably improve the removability of the semiconductor-related-member processing sheet. Another object of the present invention is to provide a method of manufacturing chips using the sheet.

Means for Solving the Problems

As a result of the inventors' studies to achieve the above objects, there has been obtained the following novel knowledge. That is, by using a semiconductor-related-member processing sheet that comprises a pressure sensitive adhesive layer comprising a polymer having an energy ray polymerizable functional group and a branched structure (such a polymer will also be referred to as a "polymerizable branched polymer" in the present description), it can be stably achieved to suppress the reliability degradation of members comprising chips manufactured from a semiconductor-related member using the semiconductor-related-member processing sheet. Compared with the free epoxy group-containing compound as disclosed in Patent Literature 1, the polymerizable branched polymer can enhance the removability of the semiconductor-related-member processing sheet even when the content is small in the pressure sensitive adhesive layer of the semiconductor-related-member processing sheet.

The present invention accomplished based on such a knowledge is as follows:

(1) A semiconductor-related-member processing sheet, comprising a base material and a pressure sensitive adhesive layer provided on or above one surface of the base material, wherein the pressure sensitive adhesive layer comprises one or more types of energy ray polymerizable compounds having an energy ray polymerizable functional group, wherein at least one type of the energy ray polymerizable compounds is a polymerizable branched polymer that is a polymer having a branched structure, wherein a contact angle of water on a measurement target surface is 40° or less when measured using a water droplet under an environment of 25° C. and a relative humidity of 50%, wherein the measurement target surface is prepared through: attaching a surface of the semiconductor-related-member processing sheet at a side of the pressure sensitive adhesive layer to a mirror surface of a silicon wafer; irradiating the semiconductor-related-member processing sheet with an energy ray to reduce a pressure sensitive adhesive property of the pressure sensitive adhesive layer to the mirror surface of the silicon wafer; and thereafter removing the semiconductor-related-member processing sheet from the silicon wafer so that the mirror surface of the silicon wafer to which the semiconductor-related-member processing sheet was attached is obtained as the measurement target surface.

(2) The semiconductor-related-member processing sheet as described in the above (1), wherein the polymerizable branched polymer has a polystyrene equivalent weight-average molecular weight of 100,000 or less.

(3) The semiconductor-related-member processing sheet as described in the above (1) or (2), wherein the energy ray polymerizable compounds comprise a polymerizable high-molecular compound that is a substance having a polystyrene equivalent weight-average molecular weight of 100,000 or more.

(4) The semiconductor-related-member processing sheet as described in any one of the above (1) to (3), wherein the semiconductor-related-member processing sheet has a peel strength of 100 mN/25 mm or less, wherein the peel strength is measured through: preparing a main surface of the semiconductor-related-member processing sheet at a side of the pressure sensitive adhesive layer as a measurement target surface; preparing a mirror surface of a silicon wafer as an adherend surface; attaching the measurement target surface and the adherend surface to each other; then irradiating the pressure sensitive adhesive layer with an energy ray to reduce a pressure sensitive adhesive property of the measurement target surface to the adherend surface; and thereafter performing a 180° peeling test in accordance with JIS Z0237: 2000 to measure the peel strength.

(5) A method of manufacturing chips, comprising: an attaching step of attaching the surface of the semiconductor-related-member processing sheet as described in any one of the above (1) to (4) at the side of the pressure sensitive adhesive layer to one surface of a semiconductor-related member; a dividing step of dividing the semiconductor-related member on the semiconductor-related-member processing sheet to obtain a plurality of chips attached to the pressure sensitive adhesive layer; an irradiating step of irradiating the pressure sensitive adhesive layer with an energy ray to reduce a pressure sensitive adhesive property of the pressure sensitive adhesive layer to surfaces of the plurality of chips attached to the pressure sensitive adhesive layer; and a picking-up step of separating the plurality of chips from the pressure sensitive adhesive layer of the semiconductor-related-member processing sheet to obtain individual chips.

(6) The method of manufacturing as described in the above (5), wherein the semiconductor-related member comprises a silicon wafer having a penetrating electrode.

Advantageous Effect of the Invention

By using the semiconductor-related-member processing sheet according to the present invention, it is possible to manufacture, from a semiconductor-related member, chips which are unlikely to deteriorate the reliability of members comprising the chips. In a preferred embodiment, it can also be achieved to enhance the removability of the semiconductor-related-member processing sheet.

BRIEF DESCRIPTION OF DRAWING(S)

FIG. 1 is a schematic cross-sectional view of a semiconductor-related-member processing sheet according to an embodiment of the present invention.

BEST MODE(S) FOR CARRYING OUT THE INVENTION

Embodiments of the present invention will be described hereinafter.

As illustrated in FIG. 1, the semiconductor-related-member processing sheet 1 according to an embodiment of the present invention comprises a base material 2 and a pressure sensitive adhesive layer 3 provided on or above one surface of the base material 2. The semiconductor-related member as used in the present description means a material used for semiconductor manufacturing, and examples thereof include wafers of semiconductor such as silicon, SiC and GaN, substrates of ceramics such as alumina and sapphire, semiconductor packages, and glass members.

1. Base Material

Constituent materials of the base material 2 of the semiconductor-related-member processing sheet 1 according to the present embodiment are not particularly limited, provided that the base material 2 does not fracture when the semiconductor-related-member processing sheet 1 is used, such as when the semiconductor-related-member processing sheet 1 is attached to an adherend and when the semiconductor-related-member processing sheet 1 is removed from the adherend. The base material 2 may ordinarily be constituted of a film that comprises a resin-based material as the main material.

Specific examples of the film include: ethylene-based copolymer film, such as ethylene-vinyl acetate copolymer film, ethylene-(meth)acrylic acid copolymer film and ethylene-(meth)acrylic ester copolymer film; polyolefin-based film, such as low-density polyethylene (LDPE) film, linear low-density polyethylene (LLDPE) film, high-density polyethylene (HDPE) film, medium-density polyethylene (MDPE) film and other polyethylene films, polypropylene film, polybutene film, polybutadiene film, polymethylpentene film, ethylene-norbornene copolymer film and norbornene resin film; polyvinyl chloride-based film, such as polyvinyl chloride film and vinyl chloride copolymer film; polyester-based film, such as polyethylene terephthalate film and polybutylene terephthalate film; polyurethane film; polyimide film; polystyrene film; polycarbonate film; and fluorine resin film. There may also be used a modified film thereof, such as a cross-linked film and an ionomer film. The above base material 2 may be a film comprising one type thereof, or may also be a laminated film comprising a combination of two or more types thereof. The "(meth) acrylic acid" as used in the present description means both acrylic acid and methacrylic acid. The same applies to other similar terms.

It is preferred that the film constituting the base material 2 comprises at least one type of an ethylene-based copolymer film and a polyolefin-based film.

The ethylene-based copolymer film is easy to control its mechanical characteristics in a wide range, such as by varying the copolymerization ratio. Therefore, the base material 2 comprising an ethylene-based copolymer film may easily fulfill the mechanical characteristics that are needed as those of the base material of the semiconductor-related-member processing sheet 1 according to the present embodiment. In addition, the ethylene-based copolymer film has a relatively high interfacial adhesion property to the pressure sensitive adhesive layer 3, and therefore is unlikely to cause delamination at the interface between the base material 2 and the pressure sensitive adhesive layer 3 when the semiconductor-related-member processing sheet 1 is used.

The ethylene-based copolymer film and the polyolefin-based film each contain only a small amount of components that negatively affect the properties as those of a semiconductor-related-member processing sheet (for example, in a polyvinyl chloride-based film or the like, a plasticizer contained in the film may migrate from the base film 2 to the pressure sensitive adhesive layer 3 and may then be distributed in a surface of the pressure sensitive adhesive layer 3 opposite to the surface facing the base film 2, thereby to deteriorate the pressure sensitive adhesive property of the pressure sensitive adhesive layer 3 to the adherend). Therefore, a problem is unlikely to occur, such as that the pressure sensitive adhesive property of the pressure sensitive adhesive layer 3 to the adherend is deteriorated. That is, the ethylene-based copolymer film and the polyolefin-based film have an excellent chemical stability.

The base material 2 may also contain various additives, such as pigment, dye, fire retardant, plasticizer, antistatic, glidant and filler, in the film that contains the above resin-based material as the main material. Examples of the pigment include titanium dioxide and carbon black. Examples of the filler include an organic material such as melamine resin, an inorganic material such as fumed silica, and a metal-based material such as nickel particle. The content of such additives is not limited, but may have to be within a range in which the base material 2 exhibits a desirable function and does not lose the smoothness and/or flexibility.

When ultraviolet ray is used as an energy ray for irradiation to cure the pressure sensitive adhesive layer 3, it is preferred that the base material 2 has transparency for the ultraviolet ray. When electron ray is used as the energy ray, it is preferred that the base material 2 has transparency for the electron ray.

It is preferred that a component having one or more types selected from the group consisting of a carboxyl group and ion and salt thereof is present at a surface of the base material 2 at the side of the pressure sensitive adhesive layer 3 (referred also to as a "base material first surface," hereinafter). The above component in the base material 2 and components relating to the pressure sensitive adhesive layer (there may be exemplified components that constitute the pressure sensitive adhesive layer 3 and components, such as a cross-linker (C), that are used when forming the pressure sensitive adhesive layer 3) may chemically interact with each other thereby to reduce the possibility of occurrence of delamination therebetween.

A specific approach for allowing such a component to be present at the base material first surface is not limited. Such a specific approach may include configuring the base material 2 itself of an ethylene-(meth)acrylic acid copolymer film, an ionomer resin film or the like, for example, and employing a resin having one or more types selected from the group consisting of a carboxyl group and ion and salt thereof, as the resin to be a material that constitutes the base material 2. Another approach for allowing the above component to be present at the base material first surface may be such that a polyolefin-based film is used as the base material 2, for example, and the side of the base material first surface is subjected to corona treatment and/or provided with a primer layer. In addition, one or more types of coating films may be provided on the opposite surface of the base material 2 to the base material first surface.

The thickness of the base material 2 is not limited, provided that troubles such as fracture do not occur when using the semiconductor-related-member processing sheet 1. The thickness may preferably be within a range of 20 μm or more and 450 μm or less, more preferably within a range of 25 μm or more and 400 μm or less, and particularly preferably within a range of 50 μm or more and 350 μm or less.

2. Pressure Sensitive Adhesive Layer

The pressure sensitive adhesive layer 3 of the semiconductor-related-member processing sheet 1 according to the present embodiment is formed of a pressure sensitive adhesive composition that contains a main agent (A) and an energy ray polymerizable compound (B) and may further contain other components such as a cross-linker (C) as necessary. As will be described later, when the energy ray polymerizable compound (B) has a property as that of the main agent (A), the pressure sensitive adhesive composition may not contain a component to independently be the main agent (A) other than the energy ray polymerizable compound (B) having a property as that of the main agent (A).

(1) Main Agent (A)

The type of the main agent (A) is not limited, provided that the main agent (A) can allow the pressure sensitive adhesive layer, in particular the pressure sensitive adhesive layer before irradiation of an energy ray, to have an appropriate pressure sensitive adhesive property. Examples of such a main agent (A) include rubber-based, acrylic-based, silicone-based, and polyvinyl ether-based resin materials. Hereinafter, an acrylic-based polymer (A1) as one type of the acrylic-based material will be described relatively in detail.

Conventionally-known acrylic-based polymer can be used as the acrylic-based polymer (A1). In view of the film-forming ability at the time of coating, the polystyrene equivalent weight-average molecular weight (Mw) of the acrylic-based polymer (A1) may preferably be 10,000 or more and 2,000,000 or less and more preferably 100,000 or more and 1,500,000 or less.

In the present description including the examples, the value of the polystyrene equivalent weight-average molecular weight (Mw) refers to a value measured as a standard polystyrene equivalent value by the gel permeation chromatography (GPC) using a solvent of tetrahydrofuran (THF). Specifically, the measurement is to be performed using a GPC measurement apparatus ("HLC-8220GPC" available from TOSOH CORPORATION) under the following condition:

Columns: TSKgelGMHXL→TSKgelGMHXL→TSKgel2000HXL

Measurement temperature: 40° C.

Flow rate: 1 ml/min

Detector: differential refractometer

The glass-transition temperature Tg of the acrylic-based polymer (A1) may preferably be within a range of −70° C. or higher and 30° C. or lower and further preferably within a range of −60° C. or higher and 20° C. or lower. The glass-transition temperature Tg can be calculated using the Fox equation.

The above acrylic-based polymer (A1) may be a homopolymer formed of one type of acrylic-based monomer, a copolymer formed of plural types of acrylic-based monomers, or a copolymer formed of one or more types of acrylic-based monomers and monomer or monomers other than the acrylic-based monomers. Specific types of a compound to be the acrylic-based monomer are not limited, and specific examples thereof include (meth)acrylic acid, (meth)acrylic ester, and derivatives thereof (such as acrylonitrile). Specific examples of the (meth)acrylic ester include: (meth)acrylate having a chain-like skeleton, such as methyl(meth)acrylate, ethyl(meth)acrylate, propyl (meth)acrylate, butyl (meth)acrylate, 2-ethylhexyl (meth)acrylate, decyl (meth)acrylate, lauryl (meth)acrylate and stearyl (meth)acrylate; (meth)acrylate having a cyclic skeleton, such as cyclohexyl (meth)acrylate, benzyl (meth)acrylate, isobornyl (meth) acrylate, dicyclopentanyl (meth)acrylate, tetrahydrofurfuryl (meth)acrylate and imide acrylate; (meth)acrylate having a hydroxyl group, such as 2-hydroxyethyl (meth)acrylate and 2-hydroxypropyl (meth)acrylate; and (meth)acrylate having a reactive functional group other than hydroxyl group, such as glycidyl (meth)acrylate and N-methylaminoethyl (meth)acrylate. Examples of a monomer other than the acrylic-based monomers include olefin such as ethylene and norbornene, vinyl acetate, and styrene. When the acrylic-based monomer is alkyl (meth)acrylate, it is preferred that the carbon number of the alkyl group is within a range of 1 to 18.

When the pressure sensitive adhesive composition for forming the pressure sensitive adhesive layer 3 according to the present embodiment contains a cross-linker (C) capable of cross-linking the acrylic-based polymer (A1) as will be described later, the type of a reactive functional group possessed by the acrylic-based polymer (A1) is not limited, and may be appropriately determined on the basis of the type of the cross-linker (C) and the like. When the cross-linker (C) is a polyisocyanate compound, specific examples of the reactive functional group possessed by the acrylic-based polymer (A1) include hydroxyl group, carboxyl group, and amino group. Among them, hydroxyl group may preferably be employed because of high reactivity with an isocyanate group, when the cross-linker (C) is a polyisocyanate compound. Method of introducing hydroxyl group as the reactive functional group into the acrylic-based polymer (A1) is not limited. One example may be a method of causing the acrylic-based polymer (A1) to have a skeleton that contains a constituent unit based on acrylate having hydroxyl group, such as 2-hydroxyethyl (meth)acrylate.

(2) Energy Ray Polymerizable Compound (B)

Specific configuration of the energy ray polymerizable compound (B) contained in the pressure sensitive adhesive composition for forming the pressure sensitive adhesive layer 3 according to the present embodiment is not limited, provided that the energy ray polymerizable compound (B) has an energy ray polymerizable group and is capable of polymerization reaction when irradiated with an energy ray such as ultraviolet ray and electron ray. The energy ray polymerizable compound (B) is polymerized thereby to reduce the pressure sensitive adhesion property of the pressure sensitive adhesive layer 3 to the surface of the adherend, so that the adherend can easily be released from the pressure sensitive adhesive layer 3. The pressure sensitive adhesive layer 3 of the semiconductor-related-member processing sheet 1 according to the present embodiment may contain the energy ray polymerizable compound (B) in a state until the energy ray irradiation, because the polymerization reaction of the energy ray polymerizable group does not substantially occur before the energy ray irradiation.

The type of the energy ray polymerizable group is not limited. Specific examples thereof include a functional group having an ethylenic unsaturated bond, such as vinyl group and (meth)acryloyl group. When the pressure sensitive adhesive composition contains the cross-linker (C), the energy ray polymerizable group may preferably be a functional group having an ethylenic unsaturated bond, and in particular a (meth)acryloyl group may be more preferable from the viewpoint of the high reactivity during the energy ray irradiation.

One type of the energy ray polymerizable compound (B) may be contained in the pressure sensitive adhesive composition, or two or more types may also be used. The molecular weight of a compound that constitutes the energy ray polymerizable compound (B) is not limited. If the molecular weight is unduly small, a concern is the volatilization of the compound in the manufacturing process, which may deteriorate the stability of the composition of the pressure sensitive adhesive layer 3. Therefore, the molecular weight of a compound that constitutes the energy ray polymerizable compound (B) may preferably be 100 or more, more preferably 200 or more, and particularly preferably 300 or more, as a weight-average molecular weight (Mw).

Specific type of a compound that constitutes the energy ray polymerizable compound (B) is not limited. Specific examples of such a compound include: alkyl (meth)acrylate having a chain-like skeleton, such as trimethylolpropane tri(meth)acrylate, tetramethylolmethane tetra(meth)acrylate, pentaerythritol tri(meth)acrylate, dipentaerythritol monohydroxy penta(meth)acrylate, dipentaerythritol hexa(meth)acrylate, 1,4-butyleneglycol di(meth)acrylate and 1,6-hexanediol di(meth)acrylate; alkyl (meth)acrylate having a cyclic skeleton, such as dicyclopentadiene dimethoxy di(meth)acrylate and isobornyl (meth)acrylate; and acrylate-based compound, such as polyethylene glycol di(meth)acrylate, oligoester (meth)acrylate, urethane (meth)acrylate oligomer, epoxy modified (meth)acrylate and polyether (meth)acrylate. When the main agent (A) contains the acrylic-based polymer (A1), the acrylate-based compound may be preferred among the above compounds because of its high compatibility to the acrylic-based polymer (A1).

The number of the energy ray polymerizable groups included in one molecule of the energy ray polymerizable compound (B) is not limited, but may preferably be 2 or more, more preferably 3 or more, and particularly preferably 5 or more.

At least one type of the energy ray polymerizable compounds (B) contained in the pressure sensitive adhesive layer 3 of the semiconductor-related-member processing sheet 1 according to the present embodiment is a polymerizable branched polymer (B1) that is a polymer having a branched structure.

The polymerizable branched polymer (B1) as used in the present description means a polymer that is one type of the energy ray polymerizable compound (B) and has an energy ray polymerizable group and a branched structure. The polymerizable branched polymer (B1) has a function to improve the removability of the semiconductor-related-member processing sheet. According to the feature that the polymerizable branched polymer (B1) has a branched structure, even when the compounding amount is small, the removability of the semiconductor-related-member processing sheet can readily be improved. The compounding amount of the polymerizable branched polymer (B1) can thus be reduced thereby to suppress the increase in a water contact angle after removal, which will be described later. Moreover, according to the feature that the polymerizable branched polymer (B1) has an energy ray polymerizable group that is polymerizable, substances originated from the polymerizable branched polymer (B1) after the energy ray irradiation are unlikely to migrate from the pressure sensitive adhesive layer to the adherend for the semiconductor-related-member processing sheet. Specific configuration of the polymerizable branched polymer (B1) (specific examples thereof include the molecular weight, degree of the branched structure, and the number of the energy ray polymerizable groups in one molecule) is not limited. A method for obtaining such a polymerizable branched polymer (B1) may include: obtaining a polymer having a branched structure, for example, by polymerizing a monomer having two or more radically polymerizable double bonds in a molecule, a monomer having an active hydrogen group and a radically polymerizable double bond in a molecule, and a monomer having a radically polymerizable double bond in a monomer; and reacting the polymer with a compound that has in a molecule a functional group capable of reacting with an active hydrogen group to form a bond and at least one radically polymerizable double bond.

In view of readily and moderately suppressing the interaction with the main agent (A) (including the energy ray polymerizable compound (B) having a property as that of the main agent (A), which will be described later), the polystyrene equivalent weight-average molecular weight (Mw) of the polymerizable branched polymer (B1) may preferably be 1,000 or more and 100,000 or less and more preferably 3,000 or more and 30,000 or less. The number of the energy ray polymerizable groups included in one molecule of the polymerizable branched polymer (B1) is not limited.

The content of the polymerizable branched polymer (B1) in the pressure sensitive adhesive layer 3 is not limited, provided that the water contact angle after removal to be described later can be within a predetermined range. If the above content is unduly high, the amount of organic substances migrating to the surface of the semiconductor-related member to which the semiconductor-related-member processing sheet 1 is attached will increase to increase the water contact angle after removal. If the content of the polymerizable branched polymer (B1) in the pressure sensitive adhesive layer 3 is unduly low, the significance that the polymerizable branched polymer (B1) is contained will be lost. Therefore, in an ordinary case, the pressure sensitive adhesive composition for forming the pressure sensitive adhesive layer 3 may preferably contain 0.01 mass parts or more and more preferably 0.1 mass parts or more of the polymerizable branched polymer (B1) to the total sum of 100 mass parts of the main agent (A) and a polymerizable high-molecular compound (B2) to be described later (when the above pressure sensitive adhesive composition also contains the polymerizable high-molecular compound (B2) to be described later, the mass parts of the main agent (A) as used in the present description means the total sum of the mass parts of the main agent (A) and the mass parts of the polymerizable high-molecular compound (B2)). According to the feature that the polymerizable branched polymer (B1) has a branched structure, even when the content in the pressure sensitive adhesive layer 3 is relatively small, there can be obtained a semiconductor-related-member processing sheet 1 which is excellent in the removability.

Depending on the type of the polymerizable branched polymer (B1), the polymerizable branched polymer (B1) may migrate to the surface of the semiconductor-related member and may be measured as particles which remain on the surface of the semiconductor-related member. Such particles (including those which are not originated from the polymerizable branched polymer (B1), here and hereinafter) may possibly deteriorate the reliability of a product based on the semiconductor-related member. Therefore, it is preferred that the number of particles remaining on the surface of the semiconductor-related member is small. Specifically, the number of particles remaining on the surface of a semiconductor-related member of a silicon wafer and having a particle diameter of 0.20 μm or more may preferably be less than 200, more preferably 150 or less, further preferably less than 100, and particularly preferably 50 or less. In view of readily satisfying such a requirement for the particles, the content of the polymerizable branched polymer (B1) may preferably be less than 8.0 mass parts, more preferably 5.0 mass parts or less, further preferably less than 3.0 mass parts, particularly preferably 2.5 mass parts or less, and extremely preferably 2.0 mass parts or less, to 100 mass parts of the main agent (A).

With regard to the energy ray polymerizable compound (B) contained in the pressure sensitive adhesive layer 3 of the semiconductor-related-member processing sheet 1 according to the present embodiment, at least one type of materials that constitute the energy ray polymerizable compound (B) may have a property as that of the main agent (A). Specific examples of such an energy ray polymerizable compound (B) having a property as that of the main agent (A) include a polymerizable high-molecular compound (B2) that is a substance having an energy ray polymerizable group and having a polystyrene equivalent weight-average molecular weight (Mw) of 100,000 or more.

The polymerizable high-molecular compound (B2) has a property as that of the main agent (A). Therefore, containing the polymerizable high-molecular compound (B2) leads to advantages, such as that the composition for forming the pressure sensitive adhesive layer 3 can be simplified (the main agent (A) need not be additionally contained when the pressure sensitive adhesive layer 3 contains the polymerizable high-molecular compound (B2)) and the existing density of the energy ray polymerizable groups in the pressure sensitive adhesive layer 3 can easily be controlled. In view of allowing the polymerizable high-molecular compound (B2) to more stably have a property as that of the main agent (A), the polystyrene equivalent weight-average molecular weight (Mw) of the polymerizable high-molecular compound (B2) may preferably be 200,000 or more and 2,000,000 or less and more preferably 300,000 or more and 1,500,000 or less.

When the energy ray polymerizable compound (B) contains the polymerizable high-molecular compound (B2), it is easy to improve the removability compared with the case in which the energy ray polymerizable compound (B) consists of a low-molecular compound.

The reason for the above is as follows. If the energy ray polymerizable compound (B) is a low-molecular compound, a main agent (A) that does not have energy ray polymerizability may have to be added in order to maintain the cohesive property of the pressure sensitive adhesive layer, but such a main agent (A) will not be incorporated into the cross-linked structure even by energy ray irradiation. On the other hand, when the energy ray polymerizable compound (B) contains the polymerizable high-molecular compound (B2), the cohesive property can be maintained even if such a main agent (A) that does not have energy ray polymerizability is not added or the added amount is small. Therefore, a strong cross-linked structure can be formed in the pressure sensitive adhesive layer 3 because the amount of components that are not incorporated into the cross-linked structure by energy ray irradiation is small, and there is a tendency that the pressure sensitive adhesive property is significantly reduced to improve the removability.

Moreover, when the energy ray polymerizable compound (B) contains the polymerizable high-molecular compound (B2), the probability increases that the polymerizable branched polymer (B1) is incorporated into such a strong cross-linked structure as the above owing to the energy ray irradiation.

A specific example of the polymerizable high-molecular compound (B2) may be a compound that is an acrylic-based polymer and has a constituent unit having an energy ray polymerizable group at the main chain or at a side chain. Such a polymerizable high-molecular compound (B2) can be prepared, for example, by a method as below. That is, the polymerizable high-molecular compound (B2) can be obtained through: preparing an acrylic-based polymer which is a copolymer configured to include a constituent unit based on (meth)acrylate that contains a functional group such as hydroxyl group, carboxyl group, amino group, substituted amino group and epoxy group and a constituent unit based on alkyl (meth)acrylate; preparing a compound having in one molecule a functional group reactive with the above functional group and an energy ray polymerizable group (e.g. a group having an ethylenic double bond); and reacting the acrylic-based polymer and the compound with each other thereby to add the energy ray polymerizable group to the above acrylic-based polymer.

Examples of the energy ray for curing the energy ray polymerizable compound (B) include ionizing radiation, i.e. X-ray, ultraviolet ray, electron ray or the like. Among them, ultraviolet ray may be preferred because the introduction of irradiation equipment is relatively easy.

When ultraviolet ray is used as the ionizing radiation, near-ultraviolet rays including rays of wavelengths of about 200 to 380 nm may be used in view of easy management. The amount of ultraviolet ray may be appropriately selected in accordance with the type of the energy ray polymerizable compound (B) and the thickness of the pressure sensitive adhesive layer 3, and may ordinarily be about 50 to 500 mJ/cm$^2$, preferably 100 to 450 mJ/cm$^2$, and more preferably 200 to 400 mJ/cm$^2$. The illuminance of ultraviolet ray may ordinarily be about 50 to 500 mW/cm$^2$, preferably 100 to 450 mW/cm$^2$, and more preferably 200 to 400 mW/cm$^2$. The ultraviolet ray source is not particularly restricted, and examples thereof to be used include a high-pressure mercury lamp, metal halide lamp, and UV-LED.

When electron ray is used as the ionizing radiation, the accelerating voltage may be appropriately selected in accordance with the type of the energy ray polymerizable compound (B) and the thickness of the pressure sensitive adhesive layer 3, and may preferably be about 10 to 1,000 kV in general. The irradiation amount may be set within a range in which the energy ray polymerizable compound (B) appropriately reacts, which may ordinarily be a range of 10 to 1,000 krad. The electron ray source is not particularly restricted, and examples thereof to be used include various electron ray accelerators, such as those of Cockcroft-Walton type, Van de Graaff type, resonance transformer type, insulated core transformer type, linear type, dynamitron type, and high-frequency type.

(3) Cross-Linker (C)

As previously described, the pressure sensitive adhesive composition for forming the pressure sensitive adhesive layer 3 according to the present embodiment may contain a cross-linker (C) that is reactive with the main agent (A) such as the acrylic-based polymer (A1). In this case, the pressure sensitive adhesive layer 3 according to the present embodiment may contain a cross-linked product obtained by the cross-linking reaction of the main agent (A) and the cross-linker (C).

The content of the cross-linker (C) is not limited. In order that the above cross-linked product can readily be formed, the content of the cross-linker (C) may preferably be 0.02 mass parts or more and 10 mass parts or less to 100 mass parts of the main agent (A). Examples of the type of the cross-linker (C) include: isocyanate-based compound; epoxy-based compound; metal chelate-based compound; polyimine compound such as aziridine-based compound; melamine resin; urea resin; dialdehydes; methylol polymer; metal alkoxide; and metal salt. Among them, a polyisocyanate compound may be preferred as the cross-linker (C) for the reasons that the cross-linking reaction can be easily controlled, etc.

The polyisocyanate compound is a compound that has two or more isocyanate groups in one molecule. Examples thereof include: aromatic polyisocyanate, such as tolylene diisocyanate, diphenylmethane diisocyanate and xylylene diisocyanate; alicyclic isocyanate compound, such as dicyclohexylmethane-4,4'-diisocyanate, bicycloheptane triisocyanate, cyclopentylene diisocyanate, cyclohexylene diisocyanate, methylcyclohexylene diisocyanate and hydrogenated xylylene diisocyanate; and isocyanate having a chain-like skeleton, such as hexamethylene diisocyanate, trimethyl hexamethylene diisocyanate and lysine diisocyanate.

There may also be used biuret products and isocyanurate products of these compounds, and modified products such as adduct products that are reaction products of these compounds and non-aromatic low-molecule active hydrogen-containing compounds such as ethylene glycol, trimethylol propane and castor oil. The above polyisocyanate compound may be constituted of one type of substance or may also be constituted of two or more types of substances.

When the pressure sensitive adhesive composition for forming the pressure sensitive adhesive layer 3 according to the present embodiment contains the cross-linker (C), an appropriate cross-linking promoter may preferably be contained therein depending on the type of the cross-linker (C) and the like. For example, when the cross-linker (C) comprises a polyisocyanate compound, the pressure sensitive adhesive composition for forming the pressure sensitive adhesive layer 3 may preferably contain an organometallic compound-based cross-linking promoter, such as an organotin compound.

(4) Other Components

The pressure sensitive adhesive composition for forming the pressure sensitive adhesive layer 3 of the semiconductor-related-member processing sheet 1 according to the present embodiment may contain, in addition to the above components, various additives such as photopolymerization initiator, coloring material, e.g. colorant and pigment, antistatic, flame retardant, and filler. It is preferred that the pressure sensitive adhesive layer 3 of the semiconductor-related-member processing sheet 1 according to the present embodiment is substantially free from a free epoxy group-containing compound as disclosed in Patent Literature 1.

Here, the photopolymerization initiator will be described relatively in detail. Examples of the photopolymerization initiator include photo initiators, such as benzoin compound, acetophenone compound, acyl phosphine oxide compound, titanocene compound, thioxanthone compound and peroxide compound, and photo sensitizers, such as amine and quinone. Specifically, there may be exemplified 1-hydroxycyclohexyl phenyl ketone, benzoin, benzoin methyl ether, benzoin ethyl ether, benzoin isopropyl ether, benzyl diphenyl sulfide, tetramethyl thiuram monosulfide, azobisisobutyronitrile, dibenzyl, diacetyl, β-chloroanthraquinone, 2,4,6-trimethyl benzoyl diphenyl phosphine oxide, and the like. When ultraviolet ray is used as the energy ray, the photopolymerization initiator may be compounded thereby to reduce the irradiation time and irradiation amount.

(5) Physical Properties, Shape, Etc.

i) Water Contact Angle after Removal

The semiconductor-related-member processing sheet 1 according to the present embodiment has a water contact angle after removal of 40° C. or less. The water contact angle after removal is defined as follows.

First, the surface of the semiconductor-related-member processing sheet 1 according to the present embodiment at the side of the pressure sensitive adhesive layer 3 is attached to a mirror surface of a flat silicon wafer which is not subjected to particular surface treatment but is cleaned. Next, the pressure sensitive adhesive layer 3 of the semiconductor-related-member processing sheet 1 is irradiated with an energy ray to reduce the pressure sensitive adhesive property of the pressure sensitive adhesive layer 3 to the mirror surface of the silicon wafer, and thereafter the semiconductor-related-member processing sheet 1 is removed from the silicon wafer. The mirror surface of the silicon wafer to which the semiconductor-related-member processing sheet 1 was attached (referred to as a "silicon surface after removal" in the present description) is thus obtained as a measurement target surface, and the contact angle on the measurement target surface measured using a water droplet under an environment of 25° C. and a relative humidity of 50% is referred to as a "water contact angle after removal" in the present description.

The water contact angle after removal being low represents that the amount of organic substances attaching to the silicon surface after removal is small, i.e., the amount of organic substances migrating from the pressure sensitive adhesive layer 3 to the mirror surface of the silicon wafer is small. Such organic substances migrating from the pressure sensitive adhesive layer 3 to the surface of a semiconductor-related member will remain on surfaces of chips obtained through a dividing process, and may possibly be one of causes to deteriorate the reliability of members comprising the chips. In addition, the organic substances migrating to the mirror surface of the silicon wafer may form a particle-like residue as referred to as particles, and if chips obtained from such a wafer are used, concerns are that the wettability with sealing resin may deteriorate and that the reliability may be poor when evaluation of the reliability is performed at a high level.

In this regard, if a semiconductor-related-member processing sheet as disclosed in Patent Literature 1, which comprises an adhesive layer that contains a free epoxy group-containing compound, is used as a protective sheet, the adhesion reliability of a protective film to a semiconductor-related member will deteriorate as found in the examples performed for model testing. This appears to be because the amount of the free epoxy group-containing compound migrating from the semiconductor-related-member processing sheet to the adherend is large.

In contrast, as previously described, the polymerizable branched polymer (B1) can improve the removability of the semiconductor-related-member processing sheet 1 even when the content of the polymerizable branched polymer (B1) is relatively small in the pressure sensitive adhesive layer 3 of the semiconductor-related-member processing sheet 1. Therefore, in the case of the semiconductor-related-member processing sheet 1 according to the present embodiment, the amount of organic substances migrating from the pressure sensitive adhesive layer 3 to an adherend is relatively small when the semiconductor-related-member processing sheet 1 is removed from the adherend. Hence, in the semiconductor-related-member processing sheet 1 according to the present embodiment, the water contact angle after removal is unlikely to increase. Thus, the chips manufactured from a semiconductor-related member using the semiconductor-related-member processing sheet 1 according to the present embodiment are excellent in the removability, in particular in the suitability for pickup, and the reliability of members comprising the chips is unlikely to deteriorate.

As described above, according to the feature of the present embodiment that the polymerizable branched polymer (B1) is contained in the pressure sensitive adhesive layer 3 of the semiconductor-related-member processing sheet 1 within a range in which the water contact angle after removal is 40° or less, it is possible to more stably achieve that the semiconductor-related-member processing sheet 1 excellent in the removability can be obtained and the reliability is unlikely to deteriorate in the members comprising the chips manufactured from a semiconductor-related member using the semiconductor-related-member processing sheet 1.

Since it is preferred that the amount of organic substances attaching to the silicon surface after removal is small, the water contact angle after removal may preferably be 30° or less, more preferably 25° or less, further preferably 22.5° or less, particularly preferably 20° or less, and extremely preferably 16° or less. The lower limit of the water contact angle after removal may be 13°, which is a value obtained when measurement is performed for a measurement target surface that is a mirror surface of a silicon wafer before the pressure sensitive adhesive layer 3 of the semiconductor-related-member processing sheet 1 is attached thereto.

ii) Adhesive Strength after Irradiation

The semiconductor-related-member processing sheet 1 according to the present embodiment may preferably have an adhesive strength after irradiation of 100 mN/25 mm or less. The adhesive strength after irradiation is defined as follows.

First, the surface of the semiconductor-related-member processing sheet 1 according to the present embodiment at the side of the pressure sensitive adhesive layer 3 is prepared as a measurement target surface, which is attached to a mirror surface of a silicon wafer as an adherend surface. Next, the side of the semiconductor-related-member processing sheet 1 is irradiated with an energy ray to reduce the pressure sensitive adhesive property of the pressure sensitive adhesive layer 3 to the mirror surface of the silicon wafer. Subsequently, a 180° peeling test is performed in accordance with JIS Z0237: 2000 except that the adherend surface is changed from the surface of a stainless test plate to the above mirror surface of the silicon wafer. The peel strength of the semiconductor-related-member processing sheet 1 as measured by this test is referred to as an "adhesive strength after irradiation" in the present description.

According to the feature of the present embodiment that the adhesive strength after irradiation of the semiconductor-related-member processing sheet 1 is 100 mN/25 mm or less, the semiconductor-related-member processing sheet 1 excellent in the removability can easily be obtained. In view of more stably enhancing the removability of the semiconductor-related-member processing sheet 1, the adhesive strength after irradiation of the semiconductor-related-member processing sheet 1 may preferably be 90 mN/25 mm or less, more preferably 70 mN/25 mm or less, further preferably 50 mN/25 mm or less, particularly preferably 40 mN/25 mm or less, and extremely preferably 35 mN/25 mm or less.

iii) Pickup Force

The semiconductor-related-member processing sheet 1 according to the present embodiment may preferably have a pickup force of 2.5 N or less. The pickup force is defined as follows.

First, a silicon wafer (diameter: 153 mm, thickness: 650 μm) is ground to a thickness of 100 μm using a grinding apparatus ("DFG8540" available from DISCO Corporation may be exemplified as a specific apparatus). The surface of the semiconductor-related-member processing sheet 1 at the side of the pressure sensitive adhesive layer 3 is attached to the ground surface. At this moment, the surface of the semiconductor-related-member processing sheet 1 at the side of the pressure sensitive adhesive layer 3 is also attached to a ring frame which is a ring-like jig arranged to surround the silicon wafer. The silicon wafer is diced to a chip size of 10 mm×10 mm using a dicing apparatus ("A-WD-4000B" available from TOKYO SEIMITSU CO., LTD. may be exemplified as a specific dicing apparatus). After the dicing, the semiconductor-related-member processing sheet 1 is stationarily placed under an environment of 23° C. and a relative humidity of 50% for 24 hours. Thereafter, the semiconductor-related-member processing sheet 1 is irradiated with an energy ray from the surface at the side of the base material 2 to reduce the pressure sensitive adhesive property of the pressure sensitive adhesive layer 3 to the ground surface of the silicon wafer. Subsequently, a tubular jig is pressed to a region between the inner circumference of the ring frame and the circumferential end portion of the wafer on the surface of the semiconductor-related-member processing sheet 1 at the side of the base material 2. The ring frame is then pulled down by 2 mm to expand the semiconductor-related-member processing sheet 1.

Thereafter, raising pins are made to come into contact with the surface of the semiconductor-related-member processing sheet 1 at the side of the base material 2 to pick up each chip. The number of the raising pins is four, and the pin positions are located at vertices of a square having sides of 8 mm. The raising amount of the pins is 1.5 mm, and the raising speed is 0.3 mm/sec. The maximum load (unit: N) applied to the raising pins during the pickup performed under the above condition is referred to as a "pickup force" in the present description.

According to the feature of the present embodiment that the pickup force of the semiconductor-related-member processing sheet 1 is 2.5 N or less, the semiconductor-related-member processing sheet 1 excellent in the removability can easily be obtained. In view of enhancing the removability of the semiconductor-related-member processing sheet 1, the pickup force of the semiconductor-related-member processing sheet 1 may preferably be 2.0 N or less.

iv) Thickness

The thickness of the pressure sensitive adhesive layer of the semiconductor-related-member processing sheet 1 according to the present embodiment is not limited. The thickness of the pressure sensitive adhesive layer 3 may ordinarily be 3 μm to 100 μm and preferably 5 μm to 80 μm.

v) Release Sheet

For the purpose of protecting the pressure sensitive adhesive layer 3 until the pressure sensitive adhesive layer 3 is attached to a semiconductor-related member, the semiconductor-related-member processing sheet 1 according to the present embodiment may be configured such that the release surface of a release sheet is attached to the opposite surface of the pressure sensitive adhesive layer 3 to the side facing the base material 2. The release sheet may be arbitrarily configured, and examples thereof include a plastic film that has been subjected to release treatment using a release agent, etc. Specific examples of the plastic film include a film of polyester, such as polyethylene terephthalate, polybutylene terephthalate and polyethylene naphthalate, and a film of polyolefin, such as polypropylene and polyethylene. Examples of the release agent to be used include silicone-based, fluorine-based and long-chain alkyl-based ones, among which the silicone-based release agent is preferred because a stable property can be obtained at low cost. The thickness of the release sheet is not particularly restricted, but may ordinarily be about 20 μm or more and 250 μm or less.

3. Method of Manufacturing Semiconductor-Related-Member Processing Sheet

Method of manufacturing the semiconductor-related-member processing sheet 1 is not limited in detail, provided that the pressure sensitive adhesive layer 3 formed of the previously-described pressure sensitive adhesive composition can be provided on or above one surface of the base material 2. As one example, the pressure sensitive adhesive layer 3 can be formed through: preparing a composition for coating that contains the previously-described pressure sensitive adhesive composition and if necessary further contains some solvent; coating one surface of the base material 2 with the pressure sensitive adhesive composition or the composition for coating using a coater, such as die coater, curtain coater, spray coater, slit coater and knife coater, to form a coating film; and drying the coating film on the one surface. Properties of the pressure sensitive adhesive composition or the composition for coating are not limited, provided that the coating can be performed.

When the pressure sensitive adhesive composition or the composition for coating contains the cross-linker (C), conditions for the above drying (such as temperature and time) may be changed, or a heating process may be separately provided, thereby to progress the cross-linking reaction of the main agent (A) and cross-linker (C) in the coating film, so that a cross-linked structure is formed with a desired existing density in the pressure sensitive adhesive layer 3. To sufficiently progress this cross-linking reaction, after the pressure sensitive adhesive layer 3 is laminated on the base material 2 using the above method or the like, aging may be performed such that the obtained semiconductor-related-member processing sheet 1 is stationarily placed, for example, in an environment of 23° C. and a relative humidity of 50% for several days.

Another example of a method of manufacturing the semiconductor-related-member processing sheet 1 may include: coating the release surface of the previously-described release sheet with the pressure sensitive adhesive composition or the composition for coating to form a coating film; drying it to form a laminate comprising the pressure sensitive adhesive layer 3 and the release sheet; and attaching the surface of the laminate at the side of the pressure sensitive adhesive layer 3 to the base material first surface of the base material 2, so that a laminate of the semiconductor-related-member processing sheet 1 and the release sheet is obtained. The release sheet of this laminate may be removed as a process material, or may keep protecting the pressure sensitive adhesive layer 3 until the semiconductor-related-member processing sheet 1 is attached to a semiconductor-related member.

4. Method of Manufacturing Chips

In recent years, as a semiconductor-related member for providing chips, there has been used a member comprising a silicon wafer that has penetrating electrodes formed using a TSV (Through Silicon Via) technique (such a semiconductor-related member having penetrating electrodes is referred also to as a "TSV wafer" in the present description). In case of carrying out the pickup for chips formed from such a TSV wafer (referred also to as "TSV chips" in the present description), it is required to sufficiently reduce the pressure sensitive adhesive property of the pressure sensitive adhesive layer of a dicing sheet (which is a specific application example of a semiconductor-related-member processing sheet) to the surfaces of TSV chips so that cracks do not occur at the through-hole portions of TSV chips when the TSV chips are raised via the dicing sheet using a collet or the like. That is, the semiconductor-related-member processing sheet to be used when manufacturing TSV chips from a TSV wafer is required to have excellent removability.

The semiconductor-related-member processing sheet 1 according to the present embodiment is excellent in the removability, and therefore can be suitably used as a semiconductor-related-member processing sheet for manufacturing TSV chips from a TSV wafer. A method of manufacturing chips from a semiconductor-related member using the semiconductor-related-member processing sheet 1 according to the present embodiment will be described with reference to a specific example when manufacturing TSV chips from a TSV wafer using the semiconductor-related-member processing sheet 1 according to the present embodiment as a dicing sheet.

First, the surface of the semiconductor-related-member processing sheet 1 according to the present embodiment at the side of the pressure sensitive adhesive layer 3 may be attached to one main surface of a TSV wafer, which represents one surface of a semiconductor-related member (attaching step). The one main surface of the TSV wafer may be a smooth surface or may also be a surface having irregularities. The region in the vicinity of the outer circumference of the semiconductor-related-member processing sheet 1 may ordinarily be attached to a ring frame.

Next, the TSV wafer on the semiconductor-related-member processing sheet 1 may be divided to obtain a plurality of TSV chips which are attached to the pressure sensitive adhesive layer 3 of the semiconductor-related-member processing sheet 1 (dividing step). Specific method for dividing the TSV wafer is not limited. Examples of the method include a method of dividing the TSV wafer using a rotating blade, a method of dividing the TSV wafer using laser ablation, and a method that comprises preliminarily forming a modified layer in the TSV wafer such as using laser and thereafter dividing the TSV wafer by applying force.

After the dividing step, the pressure sensitive adhesive layer 3 of the semiconductor-related-member processing sheet 1 may be irradiated with an energy ray to progress the polymerization reaction of the energy ray polymerizable compound (B) in the pressure sensitive adhesive layer 3 thereby to reduce the pressure sensitive adhesive property of the pressure sensitive adhesive layer 3 to the surfaces of the plurality of TSV chips attached to the pressure sensitive adhesive layer 3 (irradiating step). The type of energy ray, irradiation condition and other conditions are as described above. Here, in order to make it easy to carry out the subsequent picking-up step for the plurality of TSV chips disposed on the semiconductor-related-member processing sheet 1, an expanding step may be performed for expanding the semiconductor-related-member processing sheet 1 in a direction or directions on the main surface. The degree of this expansion may be appropriately set in consideration of a space which adjacent TSV chips should have, the tensile strength of the base material 2, and the like.

After the irradiating step, the plurality of TSV chips may be separated from the pressure sensitive adhesive layer 3 of the semiconductor-related-member processing sheet 1 to obtain individual TSV chips (picking-up step). In general, each of the TSV chips may be projected via the semiconductor-related-member processing sheet 1 using a collet, so that the TSV chip is separated from other TSV chips and the attaching surface area of the projected TSV chip to the pressure sensitive adhesive layer 3 is reduced. The projected TSV chip may then be picked up, such as by suction means. The TSV chips thus picked up in the above picking-up step may be delivered to the subsequent step such as a transportation step.

If, in the picking-up step, the pressure sensitive adhesive property of the pressure sensitive adhesive layer to the surfaces of the TSV chips is high (is not sufficiently reduced), the mechanical characteristics of the TSV chips will possibly deteriorate at portions where the penetrating electrodes are formed and/or in the vicinity thereof, depending on the hole diameter and pitch of the penetrating electrodes. If the degradation in the mechanical characteristics of the TSV chips is significant, the TSV chips may crack when the picking-up step is carried out.

In a dicing sheet of which the pressure sensitive adhesive layer contains a free epoxy group-containing compound as disclosed in the previously-described Patent Literature 1, when peeling force is applied between the chips and the dicing sheet for picking up the chips, separation (breakage) occurs preferentially at the interface between the free epoxy group-containing compound and other compounds that constitute the pressure sensitive adhesive layer or in the free epoxy group-containing compound, thereby to reduce the pickup force. However, if the separation (breakage) occurs at or in such portions, the migration of the free epoxy group-containing compound from the pressure sensitive adhesive layer to the chips will inevitably occur.

In contrast, the pressure sensitive adhesive layer 3 of the semiconductor-related-member processing sheet 1 according to an embodiment of the present invention comprises the polymerizable branched polymer (B1). According to this feature, it is possible to suppress the amount of organic substances migrating from the pressure sensitive adhesive layer 3 to a semiconductor-related member and reduce the mechanical load received by the semiconductor-related member in the picking-up step. Although it is not apparent how the polymerizable branched polymer (B1) contributes to achieving both the suppression of the migrating substances and the reduction of the pickup load, the polymerizable branched polymer (B1) appears to have a tendency to be likely to exist in the vicinity of the interface with the semiconductor-related member (TSV wafer) in the pressure sensitive adhesive layer 3. Another possibility is that the polymerizable branched polymer (B1) may be polymerized with other energy ray polymerizable compounds (B) owing to the energy ray irradiation.

As described above, according to the method of manufacturing chips according to the present embodiment, it is possible to avoid the occurrence of inappropriate pickup of chips and suppress the migrating amount of organic substances from the pressure sensitive adhesive layer 3 to the chips. Therefore, the method of manufacturing chips according to the present embodiment allows manufacturing of chips having excellent quality and can avoid the deterioration in reliability of members that comprise the chips manufactured by the manufacturing method according to the present embodiment.

The embodiments heretofore explained are described to facilitate understanding of the present invention and are not described to limit the present invention. Therefore, it is intended that the elements disclosed in the above embodiments include all design changes and equivalents to fall within the technical scope of the present invention.

For example, an intermediate layer may be provided between the base material and the pressure sensitive adhesive layer. By changing the physical properties of the pressure sensitive adhesive layer and intermediate layer, the semiconductor-related-member processing sheet may have another function. A specific example is as follows. In a state before the energy ray irradiation, the storage elastic modulus G' at 23° C. of the pressure sensitive adhesive layer may be set larger than the storage elastic modulus G' at 23° C. of the intermediate layer. According to this setting, even when the semiconductor-related member has an irregular region as in the above TSV wafer, the intermediate layer can deform in accordance with the projected profile made by the entire irregular region, thereby to allow the pressure sensitive adhesive layer to deform to follow the irregular region of the semiconductor-related member. Therefore, when the semiconductor-related-member processing sheet having a pressure sensitive adhesive layer and intermediate layer that have such physical properties is used as a dicing sheet, troubles in the dicing step are unlikely to occur, such as water impregnation into the interface between the wafer and sheet and chipping. Moreover, according to the above feature, the material (pressure sensitive adhesive) that constitutes the pressure sensitive adhesive layer having a high storage elastic modulus G' is unlikely to get into recesses of the semiconductor-related member having an irregular region. Therefore, when the semiconductor-related member is divided into chips and the chips are picked up, troubles that the pressure sensitive adhesive remains in the recesses of the chips are unlikely to occur.

When the semiconductor-related-member processing sheet according to an embodiment of the present invention has an intermediate layer, the storage elastic modulus G' at 23° C. of the pressure sensitive adhesive layer before curing is not limited. For example, the storage elastic modulus G' at 23° C. of the pressure sensitive adhesive layer before curing may preferably be $3 \times 10^5$ Pa or more and more preferably $3.5 \times 10^5$ Pa or more and $1 \times 10^7$ Pa or less. According to the feature that the storage elastic modulus G' at 23° C. of the pressure sensitive adhesive layer before curing is within the above range, troubles are more unlikely to occur that the pressure sensitive adhesive remains in the recesses of the chips which are obtained by dividing the semiconductor-related member having an irregular region.

When the semiconductor-related-member processing sheet according to an embodiment of the present invention has an intermediate layer, the storage elastic modulus G' at 23° C. of the intermediate layer is not limited. For example, the storage elastic modulus G' at 23° C. of the intermediate layer may preferably be $1 \times 10^4$ Pa or more and less than $1 \times 10^5$ Pa, more preferably $1 \times 10^4$ Pa or more and $9 \times 10^4$ Pa or less, and particularly preferably $1 \times 10^4$ Pa or more and $8 \times 10^4$ Pa or less. According to the feature that the storage elastic modulus G' at 23° C. of the intermediate layer is adjusted within the above range, the pressure sensitive adhesive layer can more readily follow the projected profile made by the entire irregular region of the semiconductor-related member.

The thickness of the intermediate layer may preferably be 5 µm or more and 50 µm or less. When the thickness of the intermediate layer is within the above range, the intermediate layer can readily deform in accordance with the deformation of the pressure sensitive adhesive layer. The thickness of the intermediate layer may more preferably be 10 µm or more and 40 µm or less, further preferably 15 µm or more and 35 µm or less, and particularly preferably 20 µm or more and 30 µm or less.

The intermediate layer can be formed, for example, using a variety of conventionally known pressure sensitive adhesives. Examples of such a pressure sensitive adhesive include, but are not limited to, rubber-based, acrylic-based, urethane-based, silicone-based and polyvinyl ether-based pressure sensitive adhesives. Energy ray curable-type, heat formable-type, and water swellable-type pressure sensitive adhesives may also be used. When using an energy ray curable (such as ultraviolet ray curable and electron ray curable)-type pressure sensitive adhesive, it is particularly preferred to use an ultraviolet ray curable-type pressure sensitive adhesive.

When the material that constitutes the intermediate layer is an acrylic-based material, the acrylic-based material may be a material that has a similar composition to that for the acrylic-based pressure sensitive adhesive exemplified as a material that constitutes the pressure sensitive adhesive layer 3 of the semiconductor-related-member processing sheet 1 according to an embodiment of the present invention. Specifically, the acrylic-based pressure sensitive adhesive may contain a main agent (A) and an energy ray polymerizable compound (B) and may further contain other components such as a cross-linker (C) as necessary. The main agent (A) may contain an acrylic-based polymer (A1), and the energy ray polymerizable compound (B) may contain a polymerizable high-molecular compound (B2).

When the material that constitutes the intermediate layer is a urethane-based material, the material may comprise a urethane-containing cured material as described in JP2013-197390A. Here, the urethane-containing cured material is a cured material obtained by energy ray curing of a compound that contains urethane oligomer and/or urethane (meth) acrylate oligomer and an energy curable-type monomer which is added as necessary.

EXAMPLES

Hereinafter, the present invention will be described further specifically with reference to examples, etc., but the scope of the present invention is not limited to these examples, etc.

Example 1

(1) Preparation of Pressure Sensitive Adhesive Composition

A pressure sensitive adhesive composition (solvent: toluene, compounding amount of each component is in solid content equivalent) was prepared having a composition as follows:
i) as a polymerizable high-molecular compound (B2), 100 mass parts of a reaction product obtained by reacting methacryloyl oxyethyl isocyanate with an acrylic polymer (butyl acrylate/methyl methacrylate/2-hydroxyethyl acrylate=60/10/30 (mass ratio), polystyrene equivalent weight-average molecular weight=600,000) so that the equivalent amount of the methacryloyl oxyethyl isocyanate would be 80% to the 2-hydroxyethyl acrylate;
ii) 0.15 mass parts of a polymerizable branched polymer (B1) ("OD-007" available from Nissan Chemical Industries, Ltd., polystyrene equivalent weight-average molecular weight: 14,000);
iii) as a cross-linker (C), 1.0 mass parts of an isocyanate component ("BHS-8515" available from TOYO INK CO., LTD.); and
iv) 3.0 mass parts of a photopolymerization initiator ("IRGACURE (registered trademark) 184" available from BASF SE).

(2) Production of Semiconductor-Related-Member Processing Sheet

A release sheet ("SP-PET381031" available from LINTEC Corporation) was prepared having a silicone-based release agent layer formed on one main surface of a polyethylene terephthalate film of a thickness of 38 μm. The release surface of this release sheet was coated with the previously described pressure sensitive adhesive composition so that the thickness of the pressure sensitive adhesive layer to be finally obtained would be 10 μm. The coating film thus obtained with the release sheet was caused to pass through an environment of 100° C. for 1 minute thereby to dry the coating film, and a laminate comprising the release sheet and the pressure sensitive adhesive layer was obtained.

One surface of an ethylene-methacrylic acid copolymer (EMAA) film was subjected to corona treatment (thickness: 80 μm, surface tension on the corona-treated surface: 54 mN/m), and the corona-treated surface was used as the base material first surface. The surface of the above laminate at the side of the pressure sensitive adhesive layer was attached to the base material first surface, and a semiconductor-related-member processing sheet comprising the base material and the pressure sensitive adhesive layer as illustrated in FIG. 1 was thus obtained in a state in which the release sheet was further laminated on the surface at the side of the pressure sensitive adhesive layer.

Example 2

A semiconductor-related-member processing sheet was obtained by performing the same operation as in Example 1 except that the content of the polymerizable branched polymer (B1) contained in the pressure sensitive adhesive composition was 0.03 mass parts.

Example 3

A semiconductor-related-member processing sheet was obtained by performing the same operation as in Example 1 except that the polymerizable branched polymer (B1) was not contained in the pressure sensitive adhesive composition.

Example 4

A semiconductor-related-member processing sheet was obtained by performing the same operation as in Example 1 except that the content of the polymerizable branched polymer (B1) contained in the pressure sensitive adhesive composition was 3.0 mass parts.

Example 5

A semiconductor-related-member processing sheet was obtained by performing the same operation as in Example 1 except that the composition of the pressure sensitive adhesive composition in Example 1 was changed as follows:
i) as a polymerizable high-molecular compound (B2), 100 mass parts of a reaction product obtained by reacting methacryloyl oxyethyl isocyanate with an acrylic polymer (2-ethylhexyl acrylate/vinyl acetate/2-hydroxyethyl acrylate=40/40/20 (mass ratio), polystyrene equivalent weight-average molecular weight=550,000) so that the equivalent amount of the methacryloyl oxyethyl isocyanate would be 80% to the 2-hydroxyethyl acrylate;
ii) 8.75 mass parts of an epoxy group-containing compound ("Seikaseven SS02-063" available from Dainichiseika Color & Chemicals Mfg. Co., Ltd.);
iii) as a cross-linker (C), 1 mass part of an isocyanate component ("BHS-8515" available from TOYOCHEM CO., LTD.); and
iv) 3 mass parts of a photopolymerization initiator ("IRGACURE 184" available from BASF SE).

Example 6

(1) Production of Pressure Sensitive Adhesive Composition A

An acrylic polymer was obtained by reacting butyl acrylate/methyl methacrylate/2-hydroxyethyl acrylate=62/10/28 (mass ratio). The acrylic polymer was reacted with methacryloyl oxyethyl isocyanate to obtain a polymerizable high-molecular compound (B2) (polystyrene equivalent weight-average molecular weight=400,000) so that 80 mol of the methacryloyl oxyethyl isocyanate would react in terms of 100 mol of the 2-hydroxyethyl acrylate in the acrylic pressure sensitive adhesive polymer. A pressure sensitive adhesive composition A was obtained by mixing, in a solvent, 100 mass parts of the polymerizable high-molecular compound (B2), 3 mass parts of a photopolymerization initiator (α-hydroxycyclohexyl phenyl ketone ("IRGACURE 184" available from BASF SE)), 8 mass parts (solid content equivalent) of a cross-linker (polyvalent isocyanato compound ("BHS-8515" available from TOYOCHEM CO., LTD.), and 0.15 mass parts of a polymerizable branched polymer (B1) ("OD-007" available from Nissan Chemical Industries, Ltd., polystyrene equivalent weight-average molecular weight=14,000).

(2) Production of Composition for Intermediate Layer

An acrylic polymer (polystyrene equivalent weight-average molecular weight=900,000) was obtained by reacting 2-ethylhexyl acrylate/2-hydroxyethyl acrylate=95/5 (mass ratio). A composition for intermediate layer was obtained by mixing 100 mass parts of the above acrylic polymer and 0.5 mass parts (solid content equivalent) of a cross-linker (polyvalent isocyanato compound ("BHS-8515" available from TOYOCHEM CO., LTD.) in a solvent.

(3) Production of Semiconductor-Related-Member Processing Sheet

A release film ("SP-PET381031 (PF)" available from LINTEC Corporation) was coated with the above composition for intermediate layer, which was then dried (drying condition: 100° C. for 1 minute) to obtain an intermediate layer (thickness: 20 µm) formed on the release film. Subsequently, the intermediate layer and a base material (ethylene-methacrylic acid copolymer film, thickness: 80 µm) were attached to each other, and the release film was removed from the intermediate layer to transfer the intermediate layer onto the base material.

Another release film ("SP-PET381031(PF)" available from LINTEC Corporation) was coated with the above pressure sensitive adhesive composition A, which was then dried (drying condition: 100° C. for 1 minute) to obtain a pressure sensitive adhesive layer (thickness: 10 µm) formed on the release film.

Thereafter, the intermediate layer with the base material and the pressure sensitive adhesive layer with the release film were attached to each other to obtain a semiconductor-related-member processing sheet.

Example 7

An acrylic pressure sensitive adhesive polymer was obtained by reacting butyl acrylate/methyl methacrylate/2-hydroxyethyl acrylate=62/10/28 (mass ratio). The acrylic pressure sensitive adhesive polymer was reacted with methacryloyl oxyethyl isocyanate to obtain a polymerizable high-molecular compound (B2) (polystyrene equivalent weight-average molecular weight=600,000) so that 80 mol of the methacryloyl oxyethyl isocyanate would react in terms of 100 mol of the 2-hydroxyethyl acrylate in the acrylic pressure sensitive adhesive polymer. A pressure sensitive adhesive composition B was obtained by mixing, in a solvent, 100 mass parts of the polymerizable high-molecular compound (B2), 3 mass parts of a photopolymerization initiator (α-hydroxycyclohexyl phenyl ketone ("IRGACURE 184" available from BASF SE)), 8 mass parts (solid content equivalent) of a cross-linker (polyvalent isocyanato compound ("BHS-8515" available from TOYOCHEM CO., LTD.), and 0.15 mass parts of a polymerizable branched polymer (B1) ("OD-007" available from Nissan Chemical Industries, Ltd., polystyrene equivalent weight-average molecular weight=14,000).

A semiconductor-related-member processing sheet was obtained by performing the same operation as in Example 6 except that the obtained pressure sensitive adhesive composition B was used as substitute for the pressure sensitive adhesive composition A.

Example 8

A pressure sensitive adhesive composition C was obtained by mixing, in a solvent, 100 mass parts of a polymerizable high-molecular compound (B2) as prepared in Example 6, 3 mass parts of a photopolymerization initiator (α-hydroxycyclohexyl phenyl ketone ("IRGACURE 184" available from BASF SE)), and 8 mass parts (solid content equivalent) of a cross-linker (polyvalent isocyanato compound ("BHS-8515" available from TOYOCHEM CO., LTD).

A semiconductor-related-member processing sheet was obtained by performing the same operation as in Example 6 except that the obtained pressure sensitive adhesive composition C was used as substitute for the pressure sensitive adhesive composition A.

Example 9

A semiconductor-related-member processing sheet was obtained in the same manner as in Example 6 except that the thickness of the pressure sensitive adhesive layer was 30 µm.

Example 10

A semiconductor-related-member processing sheet was obtained by performing the same operation as in Example 1 except that the composition of the pressure sensitive adhesive composition in Example 1 was changed as follows:
  i) as a polymerizable high-molecular compound (B2), 100 mass parts of a reaction product obtained by reacting methacryloyl oxyethyl isocyanate with an acrylic polymer (butyl acrylate/methyl methacrylate/2-hydroxyethyl acrylate=60/10/30 (mass ratio), polystyrene equivalent weight-average molecular weight=600,000) so that the equivalent amount of the methacryloyl oxyethyl isocyanate would be 80% to the 2-hydroxyethyl acrylate;
  ii) 8.75 mass parts of a polymerizable branched polymer (B1) ("OD-007" available from Nissan Chemical Industries, Ltd., polystyrene equivalent weight-average molecular weight=14,000);
  iii) as a cross-linker (C), 1.0 mass parts of an isocyanate component ("BHS-8515" available from TOYO INK CO., LTD.); and
  iv) 3.0 mass parts of a photopolymerization initiator ("IRGACURE (registered trademark) 184" available from BASF SE).

A semiconductor-related-member processing sheet was obtained by thereafter performing the same operation as in Example 1 using the obtained pressure sensitive adhesive composition.

Exemplary Test 1 <Measurement of Water Contact Angle after Removal>

First, the surface at the side of the pressure sensitive adhesive layer of the semiconductor-related-member processing sheet produced in each of the examples and comparative examples was attached to a mirror surface of a dry-polished silicon wafer (diameter: 153 mm, thickness:

650 μm) which was not subjected to particular surface treatment but was cleaned. The silicon wafer and the semiconductor-related-member processing sheet were kept under an environment of 23° C. and a relative humidity of 50% for 24 hours. Next, the semiconductor-related-member processing sheet was irradiated with an energy ray using an ultraviolet ray irradiation apparatus ("RAD2000m/8" available from LINTEC Corporation) (illuminance: 230 mW/cm$^2$, light amount: 190 mJ/cm$^2$, with nitrogen purge of a flow rate of 30 L/min) to reduce the pressure sensitive adhesive property of the pressure sensitive adhesive layer to the mirror surface of the silicon wafer. The measurement of illuminance and light amount was performed using "UV METER UVPF-36" available from EYE GRAPHICS CO., LTD). Thereafter, the semiconductor-related-member processing sheet was removed from the silicon wafer.

The mirror surface of the silicon wafer to which the semiconductor-related-member processing sheet had been attached (silicon surface after removal) was thus obtained as a measurement target surface, and a contact angle on the measurement target surface was obtained for a water droplet of 2 μl under an environment of 25° C. and a relative humidity of 50% using an automatic contact angle meter ("DSA100S" available from KRUSS GmbH) and measured as the water contact angle after removal. Measurement results of the water contact angle after removal are listed in Table 1.

Exemplary Test 2 <Measurement of Number of Particles>

The semiconductor-related-member processing sheet produced in each of the examples and comparative examples was attached to a mirror surface of a dry-polished silicon wafer (diameter: 153 mm, thickness: 650 μm) and stationarily placed in this state under an environment of 23° C. and a relative humidity of 50% for 24 hours. After the stationary placing, the semiconductor-related-member processing sheet was irradiated with an ultraviolet ray as the energy ray of the same condition as in Exemplary Test 1 from the base material surface of the semiconductor-related-member processing sheet. Thereafter, the dicing tape was removed from the silicon wafer, and the number of particles remaining on the removal surface of the silicon wafer and having a particle diameter of 0.20 μm or more was measured using a wafer surface tester ("LS-6600" available from Hitachi High-Technologies Corporation). The measurement results of the number of particles are listed in Table 1.

Exemplary Test 3 <Measurement of Adhesive Strength after Irradiation>

The surface at the side of the pressure sensitive adhesive layer of the semiconductor-related-member processing sheet produced in each of the examples and comparative examples was used as a measurement target surface, which was attached to a mirror surface of a silicon wafer as an adherend surface. The silicon wafer and the semiconductor-related-member processing sheet were kept under an environment of 23° C. and a relative humidity of 50% for 20 minutes. Next, the semiconductor-related-member processing sheet was irradiated with an energy ray under the same condition as in Exemplary Test 1 from its side to reduce the pressure sensitive adhesive property of the pressure sensitive adhesive layer to the adherend surface.

Subsequently, a 180° peeling test was performed in accordance with JIS Z0237: 2000 except that the adherend surface was changed from the surface of a stainless test plate to the above mirror surface of the silicon wafer. The peel strength of the semiconductor-related-member processing sheet 1 measured by this test was employed as the adhesive strength after irradiation of the sheet. Measurement results of the adhesive strength after irradiation are listed in Table 1.

Exemplary Test 4 <Measurement of Pickup Force>

A silicon wafer (diameter: 153 mm, thickness: 650 μm) was ground to a thickness of 100 μm using a grinding apparatus ("DFG8540" available from DISCO Corporation). The semiconductor-related-member processing sheet produced in each of the examples and comparative examples was attached to the ground surface of the silicon wafer. In addition, the surface of the semiconductor-related-member processing sheet at the side of the pressure sensitive adhesive layer was also attached to a ring frame which was a ring-like jig arranged to surround the silicon wafer.

Next, the silicon wafer was diced to a chip size of 10 mm×10 mm by performing a full-cut process to cut into the semiconductor-related-member processing sheet by a depth of 20 μm using a dicing apparatus ("A-WD-4000B" available from TOKYO SEIMITSU CO., LTD.) and a dicing blade of "NBC-ZH2050 27HECC" available from DISCO Corporation.

After the dicing, the semiconductor-related-member processing sheet was stationarily placed under an environment of 23° C. and a relative humidity of 50% for 24 hours. Thereafter, the semiconductor-related-member processing sheet was irradiated with an energy ray under the same condition as in Exemplary Test 1 from the base material surface to reduce the pressure sensitive adhesive property of the pressure sensitive adhesive layer to the ground surface of the silicon wafer.

Subsequently, a tubular jig was pressed to a region between the inner circumference of the ring frame and the circumferential end portion of the wafer on the surface of the semiconductor-related-member processing sheet at the side of the base material. The ring frame was then pulled down by 2 mm to expand the semiconductor-related-member processing sheet.

After the energy ray irradiation, raising pins were made to come into contact with the base material surface of the semiconductor-related-member processing sheet to pick up each chip. The number of the raising pins was four, and the pin positions were located at vertices of a square having sides of 8 mm. The raising amount of the pins was 1.5 mm, and the raising speed was 0.3 mm/sec. The maximum load (unit: N) applied to the raising pins during the pickup performed under the above condition was employed as the pickup force. The measurement results of the pickup force are listed in Table 1.

Exemplary Test 5 <Adhesion Reliability Test for Chips with Protection Films>

To evaluate the effect of substances migrating from the semiconductor-related-member processing sheet to an adherend to products comprising chips, a model test was performed as follows.

The semiconductor-related-member processing sheet produced in each of the examples and comparative examples was attached to a silicon wafer (#2000 polished product, thickness: 350 μm) and stationarily placed under an environment of 23° C. and a relative humidity of 50% for 1 day. The semiconductor-related-member processing sheet after being stationarily placed was irradiated with an energy ray under the same condition as in Exemplary Test 1 to reduce the pressure sensitive adhesive property of the pressure sensitive adhesive layer to the ground surface of the silicon wafer.

Thereafter, the semiconductor-related-member processing sheet was removed, and a tape for protection film formation ("Adwill LC285022" available from LINTEC Corporation) was heated at 70° C. and attached to the surface of the silicon wafer exposed due to the above removal, using a mounter ("RAD3600F/12" available from LINTEC Corporation). A laminate structure comprising the tape for protection film formation and the silicon wafer was thus obtained. The laminate structure was heated under an environment of 130° C. for 2 hours to cure the tape for protection film formation, and a protection film was obtained.

A dicing tape ("Adwill D-686H" available from LINTEC Corporation) was attached to the surface of the protection film thus obtained, using a mounter ("RAD2700F/12Sa" available from LINTEC Corporation). Next, the silicon wafer with the protection film was diced into chips with protection films of 3 mm×3 mm. Subsequently, the chips with protection films on the dicing tape were picked up.

The chips with protection films obtained by the above method were heated under an environment of 125° C. for 24 hours. The chips with protection films were then stationarily placed under an environment of 85° C. and a relative humidity of 85% for 168 hours to absorb moisture, and thereafter IR reflow of a heating time of 1 minute was performed three times in which the maximum temperature was 260° C. by preheating at 160° C. (reflow furnace: "WL-15-20DNX type" available from Sagami-Rikou Co. Ltd). Thereafter, a cycle of providing the chips with a temperature change between −65° C. and 150° C. and alternately holding the chips at each temperature for 10 minutes was repeatedly performed 1,000 cycles (apparatus used: Thermal Shock Chamber available from ESPEC CORP).

To evaluate the adhesion reliability of the protection films of the chips with protection films, the adhesion state of the protection films was observed using a scanning-type ultrasonic testing apparatus ("Hye-Focus" available from Hitachi Construction Machinery Co., Ltd). The evaluation of the adhesion reliability was performed in terms of whether or not delamination of the protection film was present at the end portion of each chip with protection film. When delamination of the protection film was not present at the end portion of the observed chip with protection film, the evaluation result was "A" (good), and when delamination was present, the evaluation result was "B" (bad). Evaluation results are listed in Table 1.

Exemplary Test 6 <Confirmation of Followability to Irregularities>

The release sheet was removed from the semiconductor-related-member processing sheet produced in each of Examples 6 to 9, and the exposed surface of the pressure sensitive adhesive layer was attached to a wafer formed with irregularities, arranged in 2 rows and 5 columns, of a diameter of 28 μm, pitch of 35 μm and height of 12 μm, using an attaching apparatus ("RAD-3510F/12" available from LINTEC Corporation). The condition of the attaching apparatus was as follows:

Push-in amount: 15 μm
Projection amount: 150 μm
Attaching stress: 0.35 MPa
Attaching speed: 5 mm/sec
Attaching temperature: 23° C.

Attaching state of the pressure sensitive adhesive layer around the irregularities was observed from the surface of the semiconductor-related-member processing sheet at the side of the base material. Specifically, bubbles generated between the semiconductor-related-member processing sheet and the wafer were observed. When the sheet was able to be attached without bubbles to the wafer surface located between a group of electrodes arranged in 2 rows and 5 columns on the above wafer and an adjacent group, but the sheet was not able to be attached to the wafer surface of 35 μm pitch located inside the group, the confirmation result was good ("A" in Table 1), and when the sheet was not able to be attached to the wafer surface located between the adjacent groups, the confirmation result was bad ("B" in Table 1). Observation was performed using a digital optical microscope ("VHX-1000" available from KEYENCE CORPORATION). Results are listed in Table 1.

TABLE 1

| | Water contact angle after removal (°) | Number of particles (pieces) | Adhesive strength after irradiation (mN/25 mm) | Pickup force (N) | Adhesion reliability of protection film | Followability to irregularities | Note |
| --- | --- | --- | --- | --- | --- | --- | --- |
| Example 1 | 20 | 20 | 35 | 2 | A | — | Example of the invention |
| Example 2 | 15 | 20 | 90 | 3 | A | — | Example of the invention |
| Example 3 | 15 | 20 | 120 | 4 | A | — | Comparative example |
| Example 4 | 30 | 100 | 25 | 1 | A | — | Example of the invention |
| Example 5 | 30 | 20 | 65 | 3 | B | — | Comparative example |
| Example 6 | 25 | 20 | 55 | 2 | A | A | Example of the invention |
| Example 7 | 27 | 20 | 48 | 2 | A | A | Example of the invention |
| Example 8 | 27 | 20 | 125 | 4 | A | A | Comparative example |

TABLE 1-continued

|  | Water contact angle after removal (°) | Number of particles (pieces) | Adhesive strength after irradiation (mN/25 mm) | Pickup force (N) | Adhesion reliability of protection film | Followability to irregularities | Note |
|---|---|---|---|---|---|---|---|
| Example 9 | 35 | 20 | 45 | 2 | A | A | Example of the invention |
| Example 10 | 41 | 200 | 20 | 1 | B | — | Comparative example |

INDUSTRIAL APPLICABILITY

The semiconductor-related-member processing sheet according to the present invention can be suitably used as a back grinding sheet, protection sheet, dicing sheet, etc. for a semiconductor-related member such as a silicon wafer and TSV wafer.

DESCRIPTION OF REFERENCE NUMERALS

1 . . . Semiconductor-related-member processing sheet
2 . . . Base material
3 . . . Pressure sensitive adhesive layer

The invention claimed is:

1. A semiconductor-related-member processing sheet, comprising:
a base material; and
a pressure sensitive adhesive layer provided on or above one surface of the base material, wherein
the pressure sensitive adhesive layer comprises one or more types of energy ray polymerizable compounds having an energy ray polymerizable functional group,
at least one type of the energy ray polymerizable compounds is a polymerizable branched polymer that is a polymer having a branched structure, and
a contact angle of water on a measurement target surface is 40° or less when measured using a water droplet under an environment of 25° C. and a relative humidity of 50%, wherein the measurement target surface is prepared through: attaching a surface of the semiconductor-related-member processing sheet at a side of the pressure sensitive adhesive layer to a mirror surface of a silicon wafer; irradiating the semiconductor-related-member processing sheet with an energy ray to reduce a pressure sensitive adhesive property of the pressure sensitive adhesive layer to the mirror surface of the silicon wafer; and thereafter removing the semiconductor-related-member processing sheet from the silicon wafer so that the mirror surface of the silicon wafer to which the semiconductor-related-member processing sheet was attached is obtained as the measurement target surface.

2. The semiconductor-related-member processing sheet according to claim 1, wherein the polymerizable branched polymer has a polystyrene equivalent weight-average molecular weight of 100,000 or less.

3. The semiconductor-related-member processing sheet according to claim 1, wherein the energy ray polymerizable compounds comprise a polymerizable high-molecular compound that is a substance having a polystyrene equivalent weight-average molecular weight of 100,000 or more.

4. The semiconductor-related-member processing sheet according to claim 1, wherein the semiconductor-related-member processing sheet has a peel strength of 100 mN/25 mm or less, wherein the peel strength is measured through: preparing a main surface of the semiconductor-related-member processing sheet at a side of the pressure sensitive adhesive layer as a measurement target surface; preparing a mirror surface of a silicon wafer as an adherend surface; attaching the measurement target surface and the adherend surface to each other; then irradiating the pressure sensitive adhesive layer with an energy ray to reduce a pressure sensitive adhesive property of the measurement target surface to the adherend surface; and thereafter performing a 180° peeling test in accordance with JIS Z0237: 2000 to measure the peel strength.

5. A method of manufacturing chips, comprising:
an attaching step of attaching the surface of the semiconductor-related-member processing sheet as recited in claim 1 at the side of the pressure sensitive adhesive layer to one surface of a semiconductor-related member;
a dividing step of dividing the semiconductor-related member on the semiconductor-related-member processing sheet to obtain a plurality of chips attached to the pressure sensitive adhesive layer;
an irradiating step of irradiating the pressure sensitive adhesive layer with an energy ray to reduce a pressure sensitive adhesive property of the pressure sensitive adhesive layer to surfaces of the plurality of chips attached to the pressure sensitive adhesive layer; and
a picking-up step of separating the plurality of chips from the pressure sensitive adhesive layer of the semiconductor-related-member processing sheet to obtain individual chips.

6. The method of manufacturing according to claim 5, wherein the semiconductor-related member comprises a silicon wafer having a penetrating electrode.

7. The semiconductor-related-member processing sheet according to claim 1, wherein
the pressure sensitive adhesive layer comprises a pressure sensitive adhesive main agent and/or a polymerizable high-molecular weight compound.

8. The semiconductor-related-member processing sheet according to claim 1, wherein
the pressure sensitive adhesive layer comprises a pressure sensitive adhesive main agent and/or a polymerizable high-molecular weight compound, and
the pressure sensitive adhesive layer contains 0.01 mass part or more and 8.0 mass parts or less of the polymerizable branched polymer to the total sum of 100 mass parts of the pressure sensitive adhesive main agent and the polymerizable high-molecular compound.

9. The semiconductor-related-member processing sheet according to claim 1, wherein
the polymerizable branched polymer reduces an adhesiveness of the pressure-sensitive adhesive layer in response to being irradiated with an energy ray.

10. The semiconductor-related-member processing sheet according to claim 8, wherein the energy ray is an ultraviolet ray or an electron ray.

11. The semiconductor-related-member processing sheet according to claim 1, wherein the polymerizable branched polymer reduces both an adhesive strength of the pressure-sensitive adhesive layer to 100 mN/25 mm or less and a force required to remove an adherend from the pressure sensitive adhesive layer to 2.5 N or less in response to being irradiated with an energy ray.

* * * * *